(12) United States Patent
Nakahara et al.

(10) Patent No.: US 8,410,478 B2
(45) Date of Patent: Apr. 2, 2013

(54) P-TYPE MGZNO-BASED THIN FILM AND SEMICONDUCTOR LIGHT EMITTING DEVICE

(75) Inventors: Ken Nakahara, Tokyo (JP); Hiroyuki Yuji, Kyoto (JP); Kentaro Tamura, Kyoto (JP); Shunsuke Akasaka, Kyoto (JP); Masashi Kawasaki, Miyagi (JP); Akira Ohtomo, Miyagi (JP); Atsushi Tsukazaki, Miyagi (JP)

(73) Assignee: Rohm Co., Ltd., Kyoto-Fu (JP)

( * ) Notice: Subject to any disclaimer, the term of this patent is extended or adjusted under 35 U.S.C. 154(b) by 453 days.

(21) Appl. No.: 12/672,444

(22) PCT Filed: Aug. 1, 2008

(86) PCT No.: PCT/JP2008/063879
§ 371 (c)(1),
(2), (4) Date: Feb. 5, 2010

(87) PCT Pub. No.: WO2009/020070
PCT Pub. Date: Feb. 12, 2009

(65) Prior Publication Data
US 2011/0114937 A1 May 19, 2011

(30) Foreign Application Priority Data
Aug. 8, 2007 (JP) .................. 2007-206998

(51) Int. Cl.
*H01L 29/12* (2006.01)
(52) U.S. Cl. ........... 257/43; 257/E29.068; 257/101; 257/102; 257/103; 438/104; 117/84; 117/108

(58) Field of Classification Search ............. 257/43, 257/E29.068; 438/104; 117/84, 108
See application file for complete search history.

(56) References Cited

U.S. PATENT DOCUMENTS
(Continued)

FOREIGN PATENT DOCUMENTS
EP 1215310 A1 * 6/2002
JP 2002-075866 A 3/2002
(Continued)

OTHER PUBLICATIONS

Zhang, X. et al., p-type conduction in wide-gap Zn1-xMgxO films grown by ultrasonic spray pyrolysis, Applied Physics Letters, vol. 87, year 2005, pp. 092101-1 to 092101-3.*

(Continued)

*Primary Examiner* — N. Drew Richards
*Assistant Examiner* — John P Dulka
(74) *Attorney, Agent, or Firm* — Rabin & Berdo, P.C.

(57) ABSTRACT

A p-type $Mg_xZn_{1-x}O$-based thin film (1) is formed on a substrate (2) made of a ZnO-based semiconductor. The p-type $Mg_xZn_{1-x}O$-based thin film (1) is composed so that X as a ratio of Mg with respect to Zn therein can be $0 \leq X < 1$, preferably $0 \leq X \leq 0.5$. In the p-type MgZnO thin film (1), nitrogen as p-type impurities which become an acceptor is contained at a concentration of approximately $5.0 \times 10^{18}$ cm$^{-3}$ or more. The p-type MgZnO thin film (1) is composed so that n-type impurities made of a group IV element such as silicon that becomes a donor can have a concentration of approximately $1.0 \times 10^{17}$ cm$^{-3}$ or less. The p-type MgZnO thin film (1) is composed so that n-type impurities made of a group III element such as boron and aluminum which become a donor can have a concentration of approximately $1.0 \times 10^{16}$ cm$^{-3}$ or less.

16 Claims, 15 Drawing Sheets

U.S. PATENT DOCUMENTS

| | | | |
|---|---|---|---|
| 6,638,846 B2 * | 10/2003 | Iwata et al. | 438/608 |
| 7,033,435 B2 * | 4/2006 | White et al. | 117/84 |
| 2002/0025621 A1 * | 2/2002 | Iwata et al. | 438/220 |
| 2004/0227150 A1 | 11/2004 | Nakahara | |
| 2007/0134842 A1 * | 6/2007 | Kotani et al. | 438/104 |

FOREIGN PATENT DOCUMENTS

JP      2004-304166 A      10/2004

OTHER PUBLICATIONS

Yamamoto T., Codoping for the fabrication of p-type ZnO, Thin Solid Films, vol. 420-421, year 2002, pp. 101-106.*

Katayama-Yoshida, H. et al., Materials design of the codoping for the fabrication of low-resistivity p-type ZnSe and GaN by ab-initio electronic structure calculation, Phys. Stat. Sol. B, vol. 202, year 1997, pp. 763-773.*

O. Schmidt et al., "Electrical characterization of ZnO including analysis of surface conductivity", Appl. Phys. A, Mar. 22, 2007, vol. 88, pp. 71-75.

A. Tsukazaki et al., "Blue Light-Emitting Diode Based on ZnO", Japanese Journal of Applied Physics vol. 44, No. 21(2005), pp. L643-L645.

A. Tsukazaki et al., "Repeated temperature modulation epitaxy for p-type doping and light-emitting diode based on ZnO", Nature Material vol. 4 (2004), pp. 1-5.

\* cited by examiner

P-TYPE MGZNO-BASED THIN FILM AND SEMICONDUCTOR LIGHT EMITTING DEVICE

TECHNICAL FIELD

The present invention relates to a p-type MgZnO-based thin film and a semiconductor light emitting device, each containing p-type impurities such as nitrogen that becomes an acceptor.

BACKGROUND ART

An MgZnO-based thin film has attracted attention as a semiconductor material for use in a semiconductor light emitting device, a high-speed electronic device, a surface acoustic wave device and the like. Note that, in the following description, a term "MgZnO-based" is a concept including MgZnO or ZnO.

In the case of using the MgZnO-based thin film as the semiconductor material, a variety of problems have occurred. As one of major problems, mentioned is that it has been difficult to convert the MgZnO thin film into p-type.

In this connection, in recent years, as seen in Non-Patent Document 1 and Non-Patent Document 2, research on a technology for converting the MgZnO thin film into the p-type and on the semiconductor light emitting device using such a p-type MgZnO thin film has been made. However, the p-type MgZnO thin films described in these documents are each formed on such a special substrate as a $ScAlMgO_4$ substrate, and accordingly, it is difficult to achieve mass production and cost reduction thereof, and it is difficult to make the MgZnO thin films into commercial products.

Here, it is considered to use a substrate made of an MgZnO-based semiconductor as a substrate for forming the p-type MgZnO thin film thereon. The substrate made of the MgZnO-based semiconductor is more easily available than the above-mentioned substrate, and accordingly, it is considered that industrial applicability of the p-type MgZnO thin film can be enhanced.

[Non-Patent Document 1] A. Tsukazaki et al., Japanese Journal of Applied Physics, Vol. 44, No. 21 (2005), pp. L643-L645

[Non-Patent Document 2] A. Tsukazaki et al., Nature Materials, Vol. 4 (2005), p. 42

DISCLOSURE OF INVENTION

Technical Problem

However, it is recognized that, even in the case of forming the p-type MgZnO-based thin film on the substrate made of the MgZnO-based semiconductor, the MgZnO-based thin film that functions as the p-type cannot be easily manufactured. Specifically, there is a problem that, even if a concentration of p-type impurities such as nitrogen in the p-type MgZnO-based thin film is increased, the MgZnO-based thin film does not sufficiently function as the p-type, or the MgZnO-based thin film is converted into n-type and does not function as the p-type.

The present invention has been created in order to solve the above-mentioned problems. It is an object of the present invention to provide the p-type MgZnO-based thin film that functions as the p-type, and a semiconductor light emitting device including the p-type MgZnO-based thin film.

Solution to Problem

In order to achieve the above-described object, a p-type MgZnO-based thin film of the present invention includes p-type impurities which become an acceptor, wherein a concentration of n-type impurities which are a group IV element and become a donor is $1.0\times10^{17}$ $cm^{-3}$ or less.

Note that a term "MgZnO-based" is a concept including MgZnO or ZnO.

Moreover, in the above-mentioned p-type MgZnO-based thin film according to the present invention, the n-type impurities may be silicon.

Moreover, another p-type MgZnO-based thin film according to the present invention includes p-type impurities which become an acceptor, wherein a concentration of n-type impurities which are a group III element and become a donor is $1.0\times10^{16}$ $cm^{-3}$ or less.

Moreover, in the above-mentioned another p-type MgZnO-based thin film according to the present invention, the n-type impurities may be aluminum or boron.

Moreover, in the above-mentioned another p-type MgZnO-based thin film according to the present invention, a concentration of n-type impurities which are a group IV element and become a donor may be $1.0\times10^{17}$ $cm^{-3}$ or less.

Moreover, in the above-mentioned another p-type MgZnO-based thin film according to the present invention, the group IV element may be silicon.

Moreover, in the above-mentioned p-type MgZnO-based thin film according to the present invention, the p-type impurities may be nitrogen.

Moreover, in the above-mentioned p-type MgZnO-based thin film according to the present invention, a concentration of the p-type impurities may be $5.0\times10^{18}$ $cm^{-3}$ or more.

Moreover, in the above-mentioned p-type MgZnO-based thin film according to the present invention, the p-type MgZnO-based thin film may be formed on a substrate made of an MgZnO-based semiconductor.

Moreover, a semiconductor light emitting device according to the present invention includes: a substrate made of an MgZnO-based semiconductor; a light emitting layer made of an MgZnO-based semiconductor formed on the substrate; and a p-type MgZnO-based layer formed on the light emitting layer and containing p-type impurities which become an acceptor, wherein a concentration of n-type impurities made of a group IV element in the p-type MgZnO-based layer is $1.0\times10^{17}$ $cm^{-3}$ or less.

Moreover, in the above-mentioned semiconductor light emitting device according to the present invention, the n-type impurities may be silicon.

Moreover, another semiconductor light emitting device according to the present invention includes: a substrate made of an MgZnO-based semiconductor; a light emitting layer made of an MgZnO-based semiconductor formed on the substrate; and a p-type MgZnO-based layer formed on the light emitting layer and containing p-type impurities which become an acceptor, wherein a concentration of n-type impurities made of a group III element in the p-type MgZnO-based layer is $1.0\times10^{16}$ $cm^{-3}$ or less.

Moreover, in the above-mentioned another semiconductor light emitting device according to the present invention, the n-type impurities may be boron or aluminum.

Moreover, in the above-mentioned another semiconductor light emitting device according to the present invention, a concentration of silicon that functions as a donor may be $1.0\times10^{16}$ $cm^{-3}$ or less.

Advantageous Effects of Invention

Though it is a matter of course that the donors should be suppressed in order to form the p-type, in accordance with the present invention, it has been able to be revealed that the donors to be particularly noted in MgZnO are the n-type impurities made of the group IV element and the group III element, and an extent to which the concentrations of the n-type impurities should be suppressed has been able to be revealed. In such a way, the concentration of the acceptor can be increased more than the concentrations of the donors efficiently. As a result, the p-type impurities fully function as the acceptor, and accordingly, the p-type MgZnO-based thin film can be allowed to function as the p-type.

Figure 1:
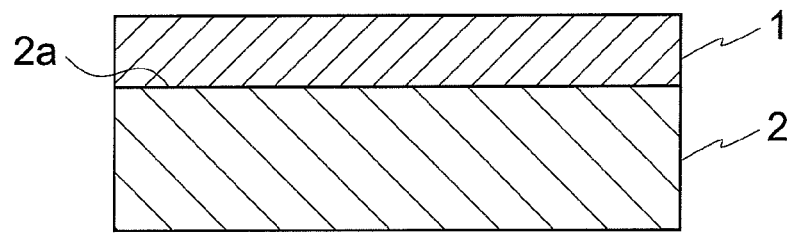
FIG. 1 is a cross-sectional view of a p-type MgZnO-based thin film according to a first embodiment.

REFERENCE SIGNS LIST 1 p-type $Mg_xZn_{1-x}O$-based thin film
2 substrate
11 MBE apparatus
14,15 radical cell
25,31 coil
26,32 discharge tube
41 semiconductor light emitting device
42 substrate
43 light emitting layer
44 p-type $Mg_xZn_{1-x}O$-based layer
45 n-side electrode
46 p-side electrode
51 sample
52 substrate
53 p-type MgZnO thin film
54 insulating film
55 first electrode
56 second electrode

BEST MODE FOR CARRYING OUT THE INVENTION (First Embodiment)
A description will be made below of a first embodiment of the present invention with reference to the drawings. Note that this embodiment is applied to a p-type semiconductor layer of a light emitting diode capable of irradiating an ultraviolet ray for use in lighting, a backlight and the like, and of a high-speed electronic device, a surface acoustic wave device and the like. FIG. 1 is a cross-sectional view of a p-type MgZnO-based thin film according to the first embodiment.

As shown in FIG. 1, a p-type $Mg_xZn_{1-x}O$-based thin film 1 is formed on a substrate 2. Note that it is not necessary to form the p-type $Mg_xZn_{1-x}O$-based thin film 1 directly on the substrate 2, and another layer may be formed between the p-type $Mg_xZn_{1-x}O$-based thin film 1 and the substrate 2 as appropriate.

Here, the p-type $Mg_xZn_{1-x}O$-based thin film 1 is composed so that X as a ratio of magnesium with respect to zinc therein can be:

$0 \leq X < 1$; preferably $0 \leq X \leq 0.5$

Note that, in the case of X=0, a ZnO thin film, which does not contain the magnesium, is formed. Meanwhile, when X is too large, a crystal structure of the p-type $Mg_xZn_{1-x}O$-based thin film 1 is changed, and accordingly, X is preferably 0.5 or less. Note that, in the case where it is not necessary to describe the ratio in particular in the following description, the $Mg_xZn_{1-x}O$-based thin film 1 is described as a p-type MgZnO thin film 1.

In the p-type MgZnO thin film 1, nitrogen is contained as p-type impurities which become an acceptor. The p-type MgZnO thin film 1 is composed so that a concentration of the nitrogen therein can become approximately $5.0 \times 10^{18}$ cm$^{-3}$ or more.

The p-type MgZnO thin film 1 is composed so that silicon as n-type impurities which function as a donor can have a concentration of approximately $1.0 \times 10^{17}$ cm$^{-3}$ or less. Moreover, the p-type MgZnO thin film 1 is composed so that aluminum and boron, which are n-type impurities functioning as donors, can have a concentration of approximately $1.0 \times 10^{16}$ cm$^{-3}$ or less.

The substrate 2 is made of $Mg_yZn_{1-y}O$ having a hexagonal crystal structure (hereinafter, hexagonal structure), which is called wurtzite. Note that the substrate 2 is composed so that Y as a ratio of magnesium with respect to zinc in $Mg_yZn_{1-y}O$ that composes the substrate 2 concerned can be:

$0 \leq Y < 1$; preferably $0 \leq Y \leq 0.5$

Figure 2:
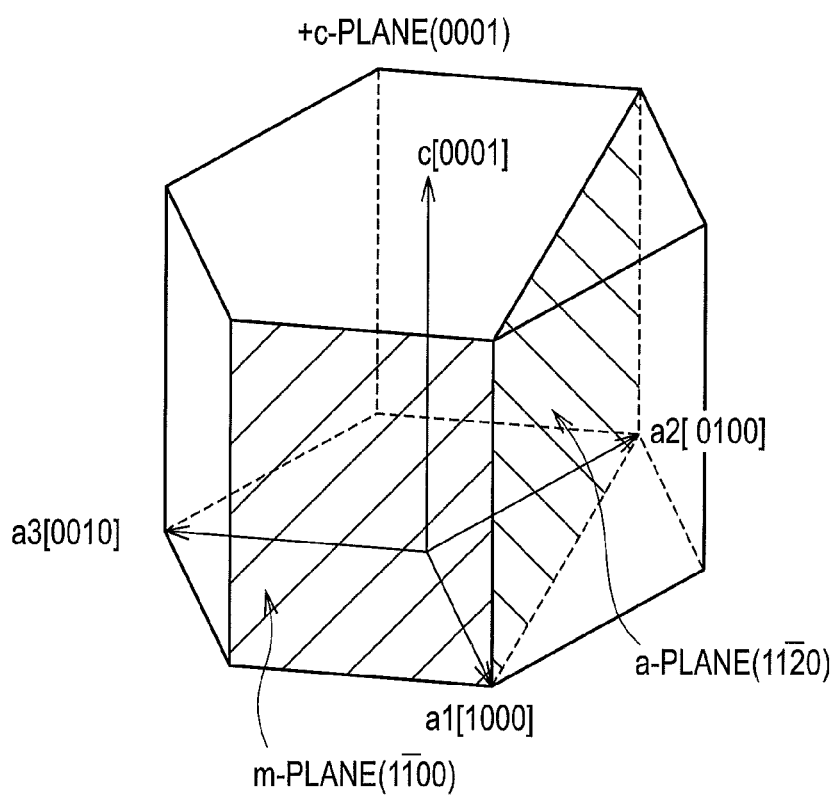
FIG. 2 is a view of a unit cell with a hexagonal structure.

Note that, in the case of Y=0, a substrate 2 made of ZnO, which does not contain the magnesium, is formed. A principal surface 2a of the substrate 2, which is a surface on which the p-type MgZnO thin film 1 is subjected to be crystal growth, is composed so as to become substantially a +c-plane. Here, a description will be made of the hexagonal structure of MgZnO or ZnO, which composes the substrate 2, with reference to FIG. 2. FIG. 2 is a view of a unit cell with the hexagonal structure.

As shown in FIG. 2, the hexagonal structure has a hexagonal column structure. As shown in FIG. 2, a central axis of the hexagonal column is defined as a c-axis [0001], and an $a_1$-axis [1000], an $a_2$-axis [0100] and an $a_3$-axis [0010] are defined in directions which are perpendicular to the c-axis and pass through non-adjacent vertices of a hexagon when the hexagon column is viewed from above. If a Miller index is used, then the +c-plane can be represented as (0001). Moreover, by using Miller indices, an m-plane as a side surface of the hexagonal column is displayed as (10-10), an a-plane as a surface that passes through a pair of non-adjacent ridge lines is displayed as (11-20), and normal vectors of the respective planes are defined as an m-axis and an a-axis. On the respective vertices and center of the +c-plane of such a hexagonal shape, group II atoms of magnesium or zinc are arranged, and on the respective vertices and center of a -c-plane, oxygen atoms are arranged.

Here, the matter that the principal surface 2a of the substrate 2 is substantially the +c-plane is a concept including not only the +c-plane but also a plane inclined from the +c-plane by a predetermined angle. An example of such an inclined plane is a plane in which a projection vector obtained by projecting the normal vector of the principal surface 2a onto the a-plane is inclined by a 3° or less from the direction of the +c-axis [0001] to a direction of a +m-axis [1-100].

Figure 3:
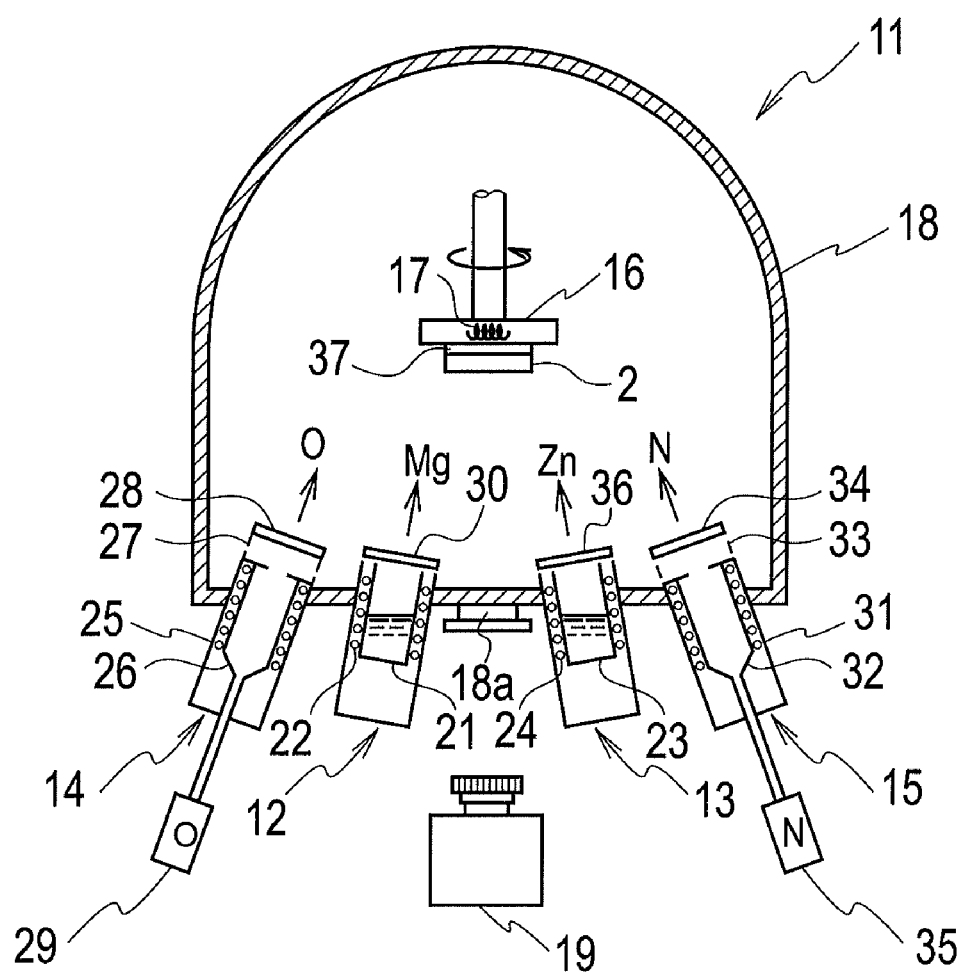
FIG. 3 is a schematic general view of an MBE apparatus.

Next, a description will be made of an MBE apparatus 11 for manufacturing the p-type MgZnO thin film 1 with reference to FIG. 3. FIG. 3 is a schematic general view of the MBE apparatus.

As shown in FIG. 3, the MBE apparatus 11 includes: a plurality of cells 12 to 15; a substrate holder 16; a heater 17; a chamber 18; a temperature measurement device (thermography) 19; and a vacuum pump (not shown).

The Knudsen cell 12 is the one for converting metal units of magnesium into molecular beams and supplying the molecular beams. The Knudsen cell 12 includes: a pBN-made crucible 21 for holding the metal units of the magnesium with a high purity (for example, 6N: 99.9999%); a heater 22 for heating the crucible 21; and a shutter 30.

The Knudsen cell 13 is the one for converting metal units of zinc into molecular beams and supplying the molecular beams. The Knudsen cell 13 includes: a pBN-made crucible 23 for holding the metal units of zinc with a high purity (for example, 7N: 99.99999%); a heater 24 for heating the crucible 23; and a shutter 36.

The radical cell 14 is the one for supplying oxygen radicals. The radical cell 14 includes: a coil 25 for generating RF plasma and converting oxygen into oxygen radicals; a discharge tube 26 made of quartz, in which a part on the substrate holder 16 side is opened; parallel electrodes 27 for trapping unnecessary ions; and a shutter 28 for supplying and shutting the oxygen radicals. Note that an oxygen source 29 for supplying oxygen source gas is connected to the radical cell 14. Here, $O_2$ gas and $O_3$ gas can be applied as the oxygen source gas. Note that such plasma conversion can be omitted in the case of applying the $O_3$ gas as the oxygen source gas.

The radical cell 15 is the one for supplying nitrogen radicals. The radical cell 15 includes: a coil 31; a discharge tube 32; parallel electrodes 33; and a shutter 34. Note that, since the respective constituents 31 to 34 are substantially the same as the constituents 25 to 28 of the radical cell 14, description thereof will be omitted. Moreover, a nitrogen source 35 for supplying nitrogen gas is connected to the radical cell 15. $N_2$ gas, NO gas, $NO_2$ gas and $N_2O$ gas can be applied as such nitrogen source gas mentioned herein.

The substrate holder 16 is the one for holding the substrate 2 thereon. The substrate holder 16 is rotatably supported at a center portion in the chamber 18. The heater 17 is the one for heating the substrate 2, and is formed of a carbon heater coated with SiC in order to prevent oxidation. The temperature measurement device 19 is the one to measure a temperature of the substrate 2 by infrared rays radiated from the substrate 2 through a window 18a of the chamber 18. A material that composes the window 18a is not particularly limited, and for example, $BaF_2$ can be applied. In order to measure an accurate temperature by the temperature measurement device 19, an infrared ray shielding film 37 is provided on a back surface (opposite surface with the principal surface 2a) of the substrate 2 for the purpose of shielding infrared rays from the substrate holder 16 or the heater 17. As an example, in the infrared ray shielding film 37, a titanium (Ti) layer with a thickness of approximately 10 nm and a platinum (Pt) layer with a thickness of approximately 100 nm are stacked on each other.

Next, a description will be made of a manufacturing method of the p-type MgZnO thin film 1.

First, the substrate 2 is prepared. Here, a fabrication method of the substrate 2 is not particularly limited, and an ingot (not shown) made of an MgZnO-based semiconductor is fabricated by a hydrothermal synthesis method. This ingot is cutout so that the principal surface 2a of the substrate 2 can become substantially the +c-plane, and thereafter, is polished by a chemical-mechanical polishing (CMP) method.

Next, the above-mentioned substrate 2 is etched by hydrochloric acid, and thereafter, is purely washed and dried by dry nitrogen. Thereafter, the substrate 2 installed onto the substrate holder 16 together with the infrared ray shielding film 37 is introduced through a load lock (not shown) into the chamber 18 of the MBE apparatus 11.

Next, an inside of the chamber 18 is evacuated until an inner pressure thereof becomes approximately $1 \times 10^{-17}$ Pa, and a vacuum is created therein. Thereafter, in a state where such a vacuum is maintained, the substrate 2 is heated at approximately 900° C. for approximately 30 minutes.

Next, a temperature of the substrate 2 is dropped down to a desired temperature. Here, the desired temperature refers to a temperature necessary for evenly maintaining the principal surface 2a of the substrate 2 and a growing surface of the p-type MgZnO thin film 1 in order to suppress the n-type impurities from being contained in the MgZnO thin film 1. For example, in the case of growing a p-type $Mg_xZn_{1-x}O$ thin film 1 in which X is approximately 0.2, the temperature of the substrate 2 is set at approximately 800° C. or more. Note that, in the case of X≦0.2, the temperature of the substrate 2 is preferably set at 800° C. or less, preferably, at 750° C. or more, and in the case of X>0.2, the temperature of the substrate 2 is preferably set at 800° C. or more.

Next, the Knudsen cell 12 is heated up to from approximately 300° C. to approximately 400° C., and the metal units of the magnesium are sublimated to supply the molecular beams of the magnesium to the substrate 2. In addition, the Knudsen cell 13 is heated up to from approximately 260° C. to approximately 280° C., and the metal units of the zinc are sublimated to supply the molecular beams of the zinc to the substrate 2. Moreover, the radical cells 14 and 15 are allowed to generate the RF plasma. The oxygen source gas and the nitrogen source gas are sputtered by the RF plasma, whereby the oxygen radicals and the nitrogen radicals are created. Then, the oxygen radicals and the nitrogen radicals are supplied onto the substrate 2 while adjusting flows thereof.

Here, the p-type MgZnO thin film 1 has a deep valence band (which means that large energy is required for creating holes in the valence band). Accordingly, forming the holes in the valence band destabilizes the crystals. Therefore, the p-type MgZnO thin film 1 has an extremely strong self-compensation effect wherein the donor compensating the holes is formed. Note that, with regard to the self-compensation effect, it is frequent that an origin thereof is induction of a point defect, which is caused by the p-type impurities which become the acceptor being contained in the p-type MgZnO thin film 1. In the case of forming the p-type MgZnO thin film 1 having the strong self-compensation effect as described above by the MBE apparatus 11 that generates the RF plasma in the discharge tubes 26 and 32 made of the quartz, the n-type impurities such as the silicon, the aluminum and the boron are prone to come flying from the discharge tubes 26 and 32 and to be captured into the p-type MgZnO thin film 1. However, in this embodiment, the temperature of the substrate 2 is set as mentioned above, whereby such planarity of the growing surface of the p-type MgZnO thin film 1 is maintained, and the n-type impurities can be suppressed from being captured thereinto. Note that, though a reason that the n-type impurities become less likely to be captured by planarizing the growing surface is unclear, the reason is conceived to be that, when the matter that the nitrogen is likely to be captured on the +c-plane is considered, the +c-plane has a mechanism to eliminate cations (which means that polarization charges exist so as to be positively charged).

Then, the above-mentioned raw materials are supplied for a predetermined time until a thickness thereof becomes desired, whereby the p-type MgZnO thin film 1 that satisfies the above-mentioned concentrations of the n-type impurities is formed.

As mentioned above, the p-type MgZnO thin film 1 according to the first embodiment is composed so that the concentration of the silicon that functions as the donor can become approximately $1.0 \times 10^{17}$ cm$^{-3}$ or less, and accordingly, the p-type MgZnO thin film 1 can be allowed to function as the p-type. Moreover, the p-type MgZnO thin film 1 is composed so that the concentrations of the boron and the aluminum therein can become approximately $1.0 \times 10^{16}$ cm$^{-3}$ or less, thereby can be allowed to function as the p-type.

(Second Embodiment)

Figure 4:
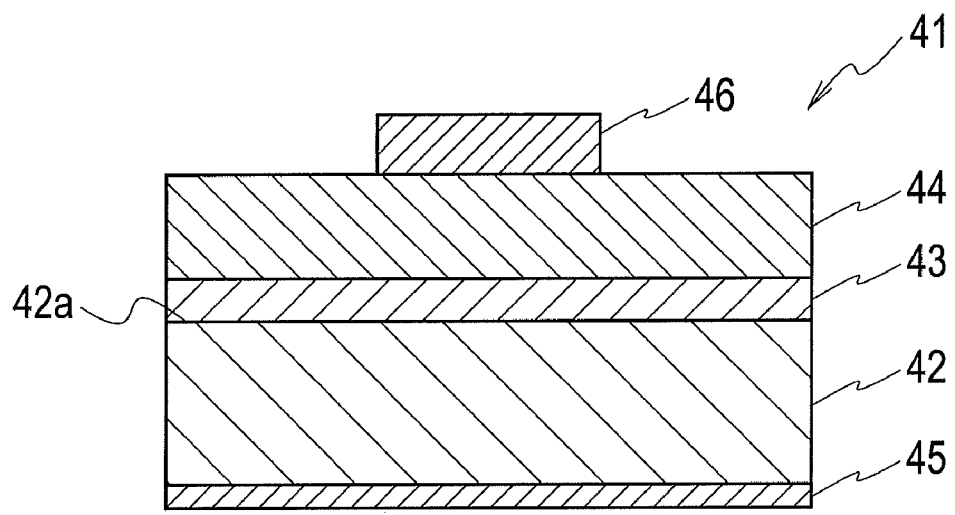
FIG. 4 is a cross-sectional view of a semiconductor light emitting device according to a second embodiment.

Next, a description will be made of a second embodiment in which the above-mentioned p-type MgZnO thin film is applied to the semiconductor light emitting device. FIG. 4 is a cross-sectional view of the semiconductor light emitting device according to the second embodiment.

As shown in FIG. 4, the semiconductor light emitting device 41 according to the second embodiment includes: a substrate 42; a light emitting layer 43; a p-type $Mg_xZn_{1-x}O$-based layer 44; an n-side electrode 45; and a p-side electrode 46. Note that X is: $0 \leq X < 1$; preferably $0 \leq X \leq 0.5$. The substrate 42 is made of n-type ZnO, in which a principal surface 42a is composed of substantially a +c-plane. The light emitting layer 43 is formed of a non-doped ZnO layer or MgZnO layer having a thickness of approximately 10 nm. In the p-type MgZnO layer 44, a concentration of nitrogen that becomes an acceptor, and concentrations of silicon, aluminum and boron, which function as donors, are the same as those of the p-type MgZnO thin film 1 mentioned in the first embodiment. The p-type MgZnO layer 44 has a thickness of approximately 300 nm. The n-side electrode 45 is formed of an indium (In) film formed on the entire back surface of the substrate 42. The p-side electrode 46 is formed on a part of an upper surface of the p-type MgZnO layer 44. The p-side electrode 46 has a structure in which a nickel (Ni) layer and a gold (Au) layer are sequentially stacked in order from the p-type MgZnO layer 44.

As described above, the semiconductor light emitting device 41 according to the second embodiment is fabricated by using the p-type MgZnO layer 44 in which the concentration of the n-type impurities is the same as that of the p-type MgZnO thin film 1 according to the first embodiment. Accordingly, the p-type MgZnO layer 44 can be allowed to function as the p-type, and light can be emitted in the light emitting layer 43.

Moreover, crystallinity of the p-type MgZnO layer 44 can be enhanced by reducing the concentration of the n-type impurities. In such a way, a peak of the light emission in the light emitting layer 43 can be sharpened (a half width thereof can be reduced), and in addition, light emission at a wavelength inherent in the MgZnO-based semiconductor is realized, and light emission efficiency can be enhanced.

A description will be made below of experiments performed in order to verify effects of the p-type MgZnO thin film 1 and the semiconductor light emitting device 41 according to the present invention mentioned above.

(First Experiment—Silicon Concentration and P-Type Conversion)

Figure 5:
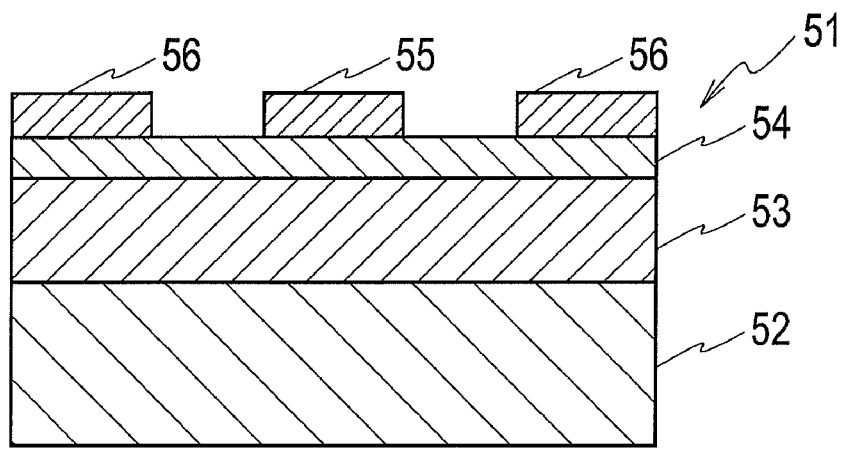
FIG. 5 is a cross-sectional view of a sample for use in CV measurement.

First, a description will be made of a first experiment in which a relationship between the concentration and p-type conversion of the silicon in the p-type MgZnO thin film was investigated by secondary ion mass spectroscopy (SIMS) measurement and capacitance-voltage (CV) measurement. Note that FIG. 5 is a cross-sectional view of a sample for use in the CV measurement.

In the first experiment, for the purpose of the SIMS measurement, samples, each of which was composed of the p-type MgZnO thin film formed on the substrate, were fabricated. A first example was fabricated as a sample according to the present invention. Moreover, a first comparative example was fabricated as a sample to be compared with the first example. The first comparative example was obtained by growing the p-type MgZnO thin film in a state where the temperature of the substrate was set at approximately 800° C. Moreover, the first comparative example was obtained by growing a p-type MgZnO thin film in a state where the temperature of the substrate was set at approximately 700° C. The temperature of each substrate was measured by the temperature measurement device through the $BaF_2$-made window in a state where the titanium (Ti) layer (approximately 10 nm) and the platinum (Pt) layer (approximately 100 nm) were provided on the back surface of the substrate, and emissivity was 0.71.

First, the concentrations of the silicon in the first example and the first comparative example were measured by the SIMS measurement. Measurement results of the concentrations of the silicon in the first example and the first comparative example are shown in FIG. 6 and FIG. 7, respectively.

Figure 6:
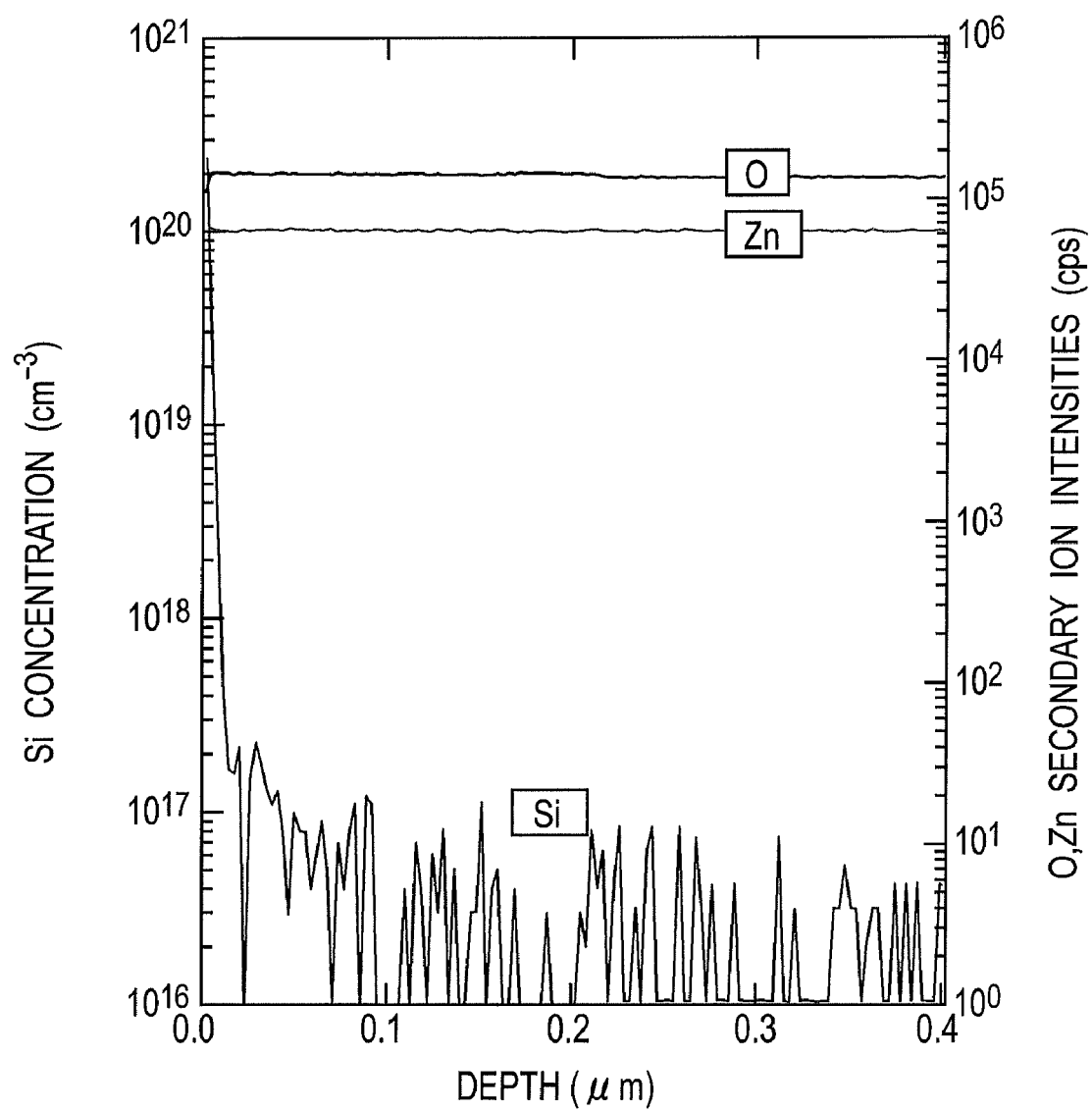
FIG. 6 is a measurement result of a concentration of silicon in a first experiment according to an example.
Figure 7:
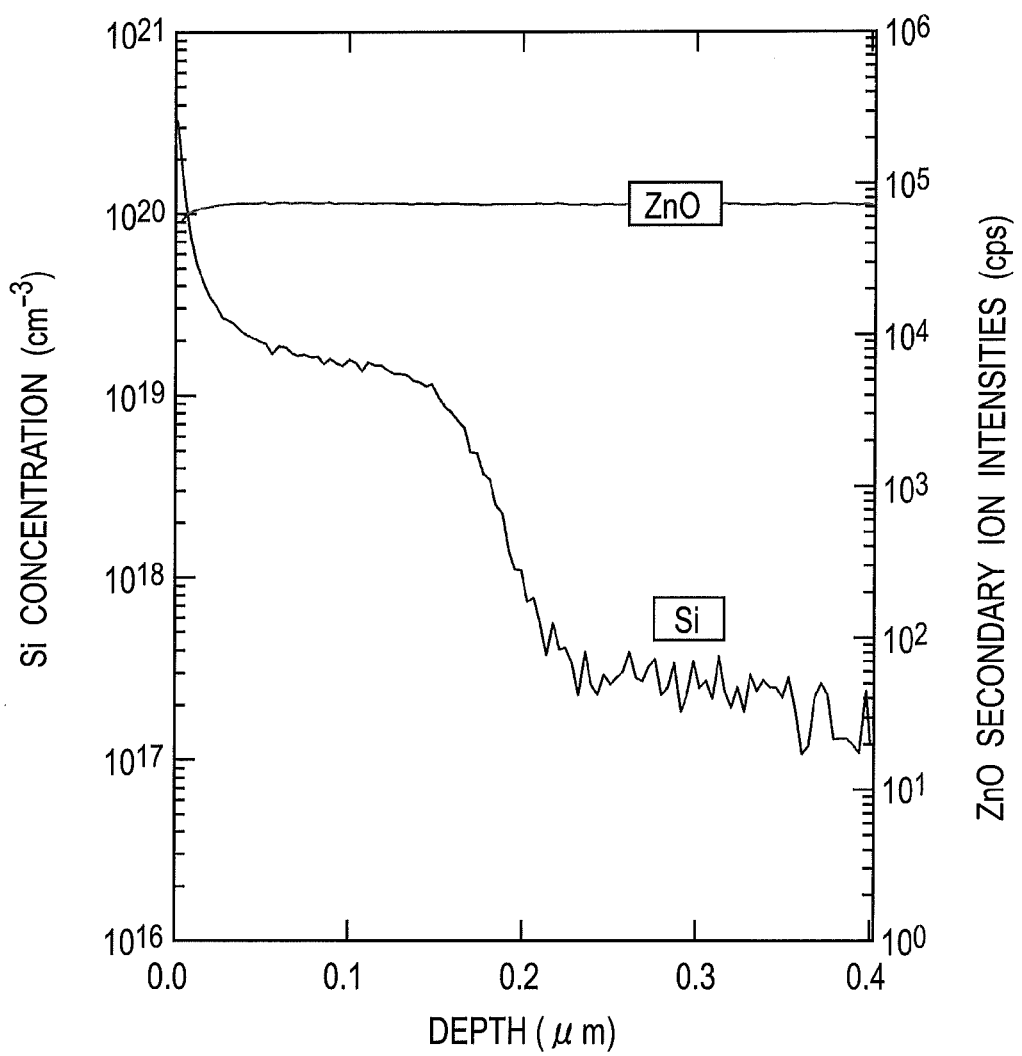
FIG. 7 is a measurement result of a concentration of silicon in a first experiment according to a comparative example.

In FIG. 6, a left-side vertical axis of ordinates represents the concentration (cm$^{-3}$) of the silicon in a logarithm scale, a right-side vertical axis of ordinates represents secondary ion intensities (counts/second) of Zn and O in the logarithm scale, and a horizontal axis of abscissas represents a depth (μm) from the surface. In FIG. 7, a left-side vertical axis of ordinates represents the concentration (cm$^{-3}$) of the silicon in the logarithm scale, a right-side vertical axis of ordinates represents secondary ion intensity (counts/second) of ZnO in the logarithm scale, and a horizontal axis of abscissas represents a depth (μm) from the surface. Note that suffixes of the respective curves indicate ions of the respective elements and the compound.

As shown in FIG. 6, the concentration of the silicon according to the first example becomes approximately $1.0 \times 10^{17}$ cm$^{-3}$ or less. Note that, though a region where the concentration of the silicon is high is observed in the vicinity (depth: 0.05 μm or less) of the surface, the SIMS frequently exhibits such an abnormal value in the vicinity of the surface owing to hydrocarbon and the like generally adhered thereonto. Accordingly, a SIMS signal in the vicinity of the surface does not have reliability. Meanwhile, as shown in FIG. 7, the concentration of the silicon according to the first comparative example becomes approximately $1.0 \times 10^{17}$ cm$^{-3}$ or more, and in a region (depth: approximately 0.15 μm or less) near the surface, becomes approximately $1.0 \times 10^{19}$ cm$^{-3}$ or more.

Next, in order to perform the CV measurement, the sample 51 shown in FIG. 5 was fabricated as a second example of the sample according to the present invention. The sample 51 includes: a substrate 52 made of ZnO; a p-type MgZnO thin film 53 formed on the substrate 52; an insulating film 54 formed on the p-type MgZnO thin film 53; and a first electrode 55 and a second electrode 56, which are formed on the insulating film 54. The p-type MgZnO thin film 53 contains nitrogen that functions as the acceptor and has a concentration of approximately $5 \times 10^{18}$ cm$^{-3}$ or more. Here, the p-type MgZnO thin film 53 of the second example has the same concentration of the silicon as that of the first example. The insulating film 54 is made of a spin-on-glass (SOG) film with a thickness of approximately 1000 Å. Each of the first electrode 55 and the second electrode 56 has a structure in which a Ti layer with a thickness of approximately 100 Å and an Au layer with a thickness of approximately 2000 Å are stacked on each other. The first electrode 44 is formed into a circular shape having a diameter of approximately 100 μm, and the second electrode 56 is formed so as to surround the first electrode 55 at a predetermined interval. Moreover, a second comparative example was fabricated as a sample for comparison. The sample of the second comparative example has the same configuration as the sample 51 of the second example except that the concentration of the silicon of the p-type MgZnO thin film 53 was different therefrom. Note that the p-type MgZnO thin film in the second comparative example has the same concentration of the silicon as that of the first comparative example.

The CV measurement was performed by using the above-mentioned second example and second comparative example. As result of the CV measurement, in the second example, a relationship of: $N_A - N_D = 1 \times 10^{16}$ cm$^{-3}$ was established, and it was recognized that the p-type MgZnO thin film was converted into the p-type. Meanwhile, as a result of the CV measurement, in the second comparative example, a relationship of: $N_D - N_A = 5 \times 10^{17}$ cm$^{-3}$ was established, and it was recognized that the p-type MgZnO thin film was converted into the n-type. Note that $N_A$ indicates a concentration of the acceptor, and $N_D$ indicates a concentration of the donor.

In such a way, it was recognized that the p-type MgZnO thin film was able to be converted into the p-type by setting the concentration of the silicon as the n-type impurities which function as the donor at $1.0 \times 10^{17}$ cm$^{-3}$ or less.

(Second Experiment—Relationship between Silicon Concentration and Light Emission)

A description will be made of a second experiment in which a relationship between the concentration of the silicon in the p-type MgZnO thin film and the light emission was investigated.

In the second experiment, as samples for the SIMS measurement and electroluminescence (EL) measurement, samples were fabricated, each of which was composed of the p-type MgZnO thin film formed on the substrate made of ZnO. A sample according to the present invention was used as a third example, and a sample for comparison was used as a third comparative example. Note that, in the third example, the p-type MgZnO thin film was grown while setting the temperature of the substrate at approximately 870° C. In the third comparative example, the p-type MgZnO thin film was grown while setting the temperature of the substrate at approximately 800° C.

First, in the second experiment, the concentrations of the nitrogen and the silicon and the secondary ion intensity of MgO in the p-type MgZnO thin film were measured by the SIMS method. Thereafter, the surface of the p-type MgZnO thin film was observed, and in addition, it was investigated whether the light emission (EL: electroluminescence) was caused by current injection. An experimental result of the third example is shown in FIG. 8, and an experimental result of the third comparative example is shown in FIG. 9.

Figure 8A:
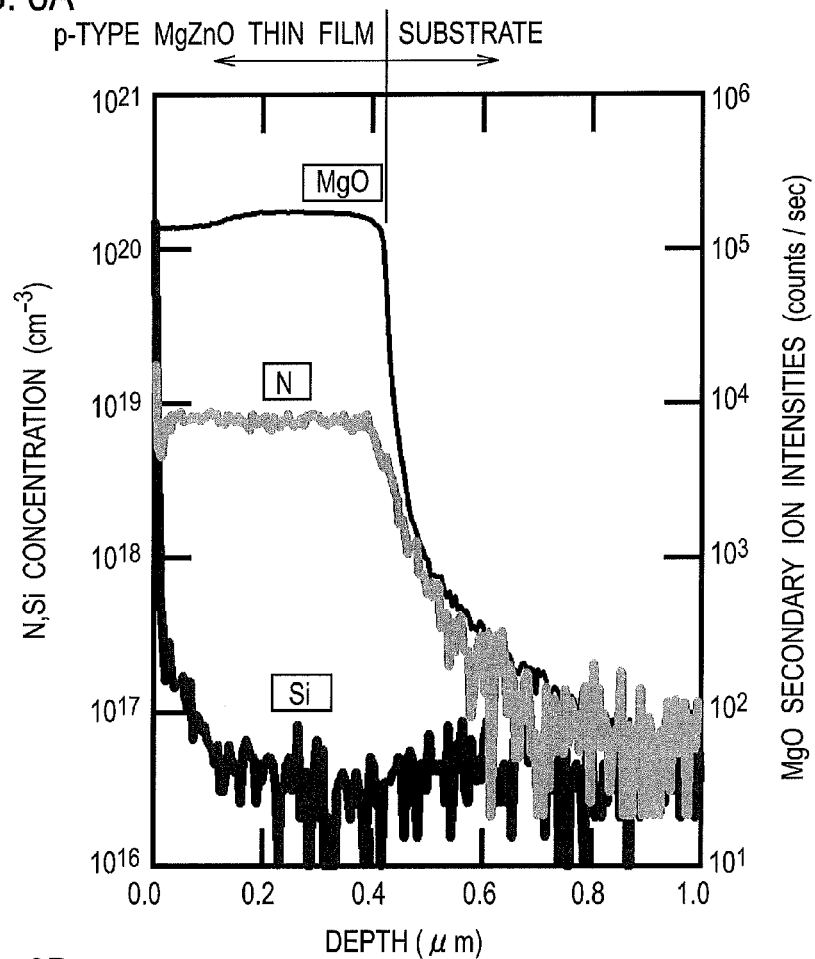
FIGS. 8A to 8C are an experimental result of a second experiment according to an example.
Figure 8B:
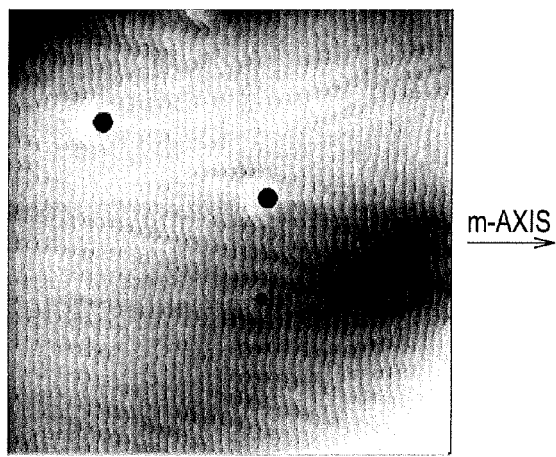
Figure 8C:
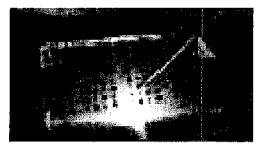
Figure 9A:
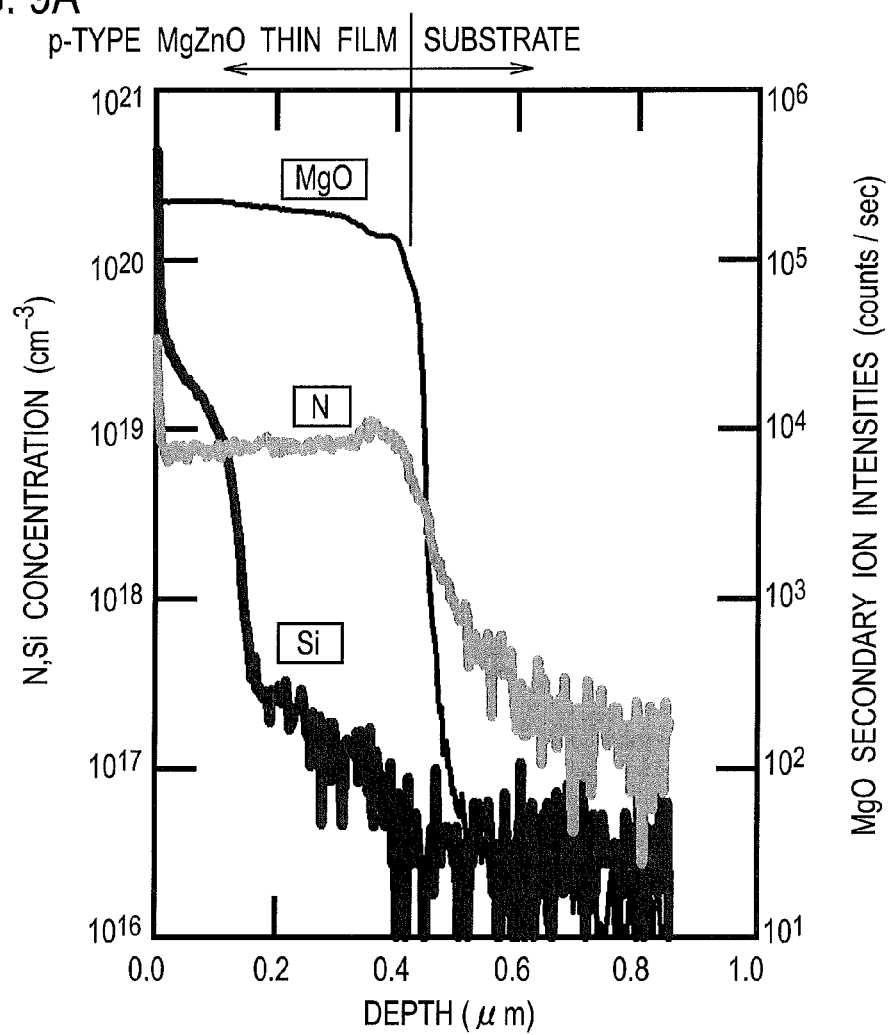
FIGS. 9A and 9B are an experimental result of a second experiment according to a comparative example.
Figure 9B:
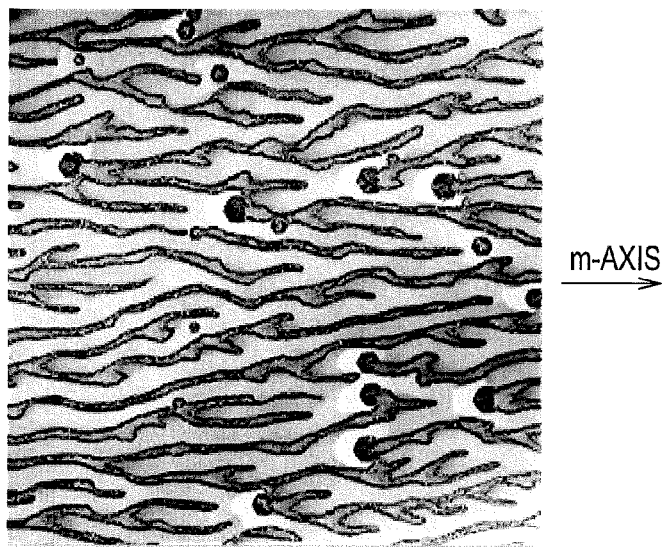

FIG. 8A and FIG. 9A are graphs showing measurement results by the SIMS measurements. In each of FIG. 8A and FIG. 9A, a left-side vertical axis of ordinates represents the concentrations (cm$^{-3}$) of the silicon and the nitrogen in the logarithm scale, a right-side vertical axis of ordinates represents the secondary ion intensity (counts/second) of MgO in the logarithm scale, and a horizontal axis of abscissas represents the depth (μm) from the surface. Suffixes of the respective curves indicate ions of the respective elements and the compound. Note that, since the substrate made of ZnO is applied, the depth at which MgO is reduced corresponds to an interface between the p-type MgZnO thin film and the substrate. FIG. 8B and FIG. 9B are results of observing the surfaces of the p-type MgZnO thin films by an atomic force microscope (AFM), and each side of FIG. 8B and FIG. 9B is approximately 20 μm. FIG. 8C is a photograph showing a light emission state of the third example.

As shown in FIG. 8A, it is recognized that the concentration of the silicon in the p-type MgZnO thin film according to the third example becomes approximately $1.0 \times 10^{17}$ cm$^{-3}$ or less. Note that, though a region where the concentration of the silicon is high is observed in the vicinity (depth: 0.1 μm or less) of the surface, the SIMS frequently exhibits such an abnormal value in the vicinity of the surface owing to the hydrocarbon and the like generally adhered thereonto. Accordingly, an SIMS signal in the vicinity of the surface does not have reliability. Meanwhile, as shown in FIG. 9A, the concentration of the silicon in the p-type MgZnO thin film according to the third comparative example becomes approximately $1.0 \times 10^{17}$ cm$^{-3}$ or more, and becomes approximately $2.0 \times 10^{17}$ cm$^{-3}$ or more depending on the depth, and in some shallower region, becomes approximately $1.0 \times 10^{18}$ cm$^{-3}$ or more. Note that, as apparent from FIG. 8A and FIG. 9A, the concentrations of the nitrogen that becomes the acceptors in the p-type MgZnO thin films in the third example and the third comparative example are approximately $5.0 \times 10^{18}$ cm$^{-3}$ or more.

Here, as shown in FIG. 8B, on the surface of the p-type MgZnO thin film according to the third example, which was observed by the AFM, steps substantially perpendicular to an m-axis direction are formed at a substantially equal interval, and it is recognized that the steps have regularity. Meanwhile, as shown in FIG. 9B, on the surface according to the third comparative example, irregularities are formed irregularly, and it is recognized that the surface is rough. From this fact, it is recognized that the silicon that comes flying from the quartz for use in the radical cells for supplying the silicon is prone to be captured into the p-type MgZnO thin film in the case where the surface is rough.

Moreover, while the light emission (white portion in FIG. 8C) was observed in the third example as shown in FIG. 8C, the light emission was not observed (which is not shown) in the third comparative example. From this fact, it is recognized that, though the p-type MgZnO thin film of the third example according to the present invention is converted into the p-type, the p-type MgZnO thin film according to the third comparative example, in which the concentration of the silicon functioning as the donor is high, is not converted into the p-type.

(Third Experiment—Relationship Between Aluminum Concentration and Light Emission)

A description will be made of a third experiment in which a relationship between the concentration of the aluminum in the p-type MgZnO thin film and the light emission was investigated.

In the third experiment, as samples for the SIMS and EL measurements, samples were fabricated, each of which was composed of the p-type MgZnO thin film formed on the substrate made of ZnO. A sample according to the present invention was used as a fourth example, and a sample for comparison was used as a fourth comparative example. Note that, in the fourth example, the p-type MgZnO thin film was grown while setting the temperature of the substrate at approximately 750° C. In the fourth comparative example, the p-type MgZnO thin film was grown while setting the temperature of the substrate at approximately 800° C. Note that, in the fourth comparative example, a substrate contaminated by the aluminum on purpose was used.

First, in the third experiment, the concentrations of the nitrogen and the aluminum (Al) and the secondary ion intensity of the magnesium in the p-type MgZnO thin film were measured by the SIMS method. Thereafter, it was investigated whether the light emission was caused. An experimental result of the fourth example is shown in FIG. 10, and an experimental result of the fourth comparative example is shown in FIG. 11.

Figure 10A:
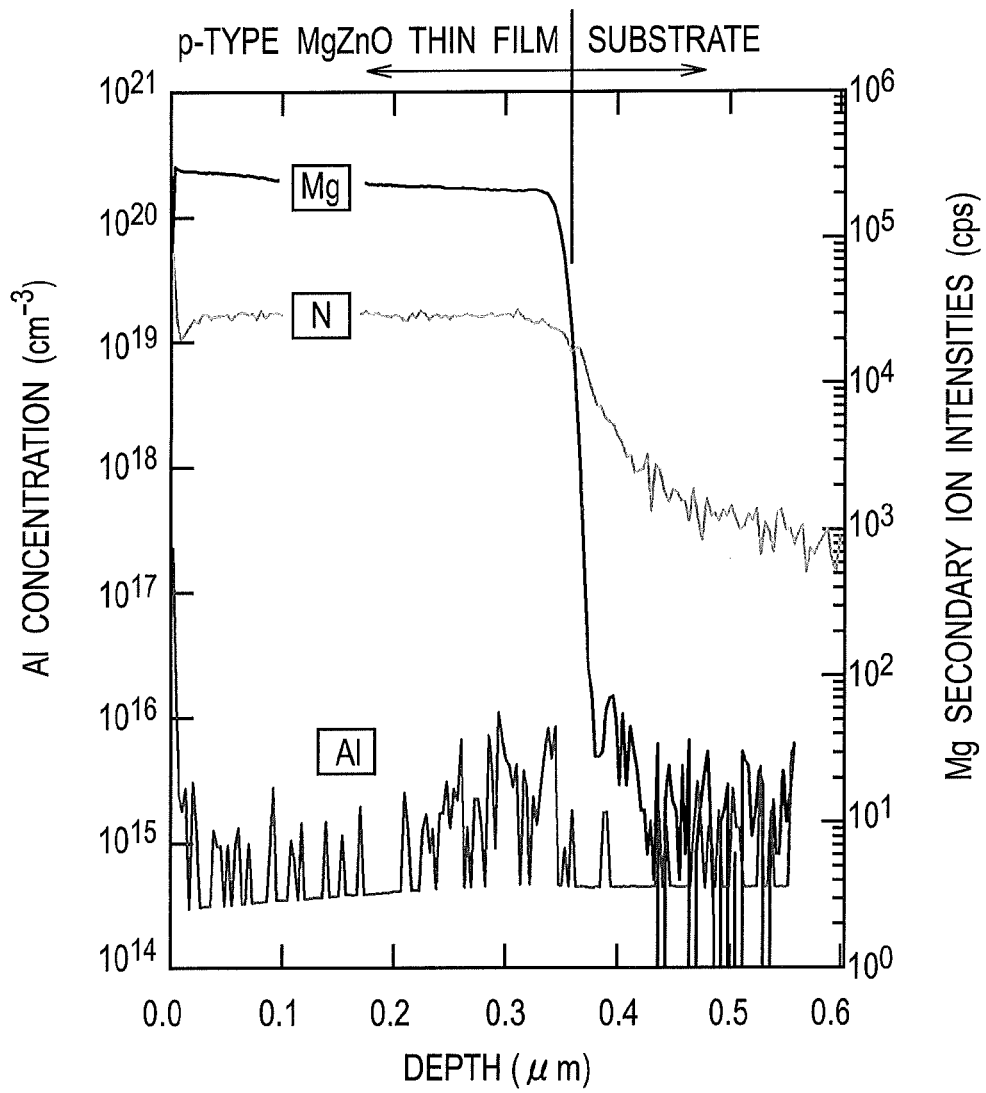
FIGS. 10A and 10B are an experimental result of a third experiment according to an example.
Figure 10B:
Figure 11:
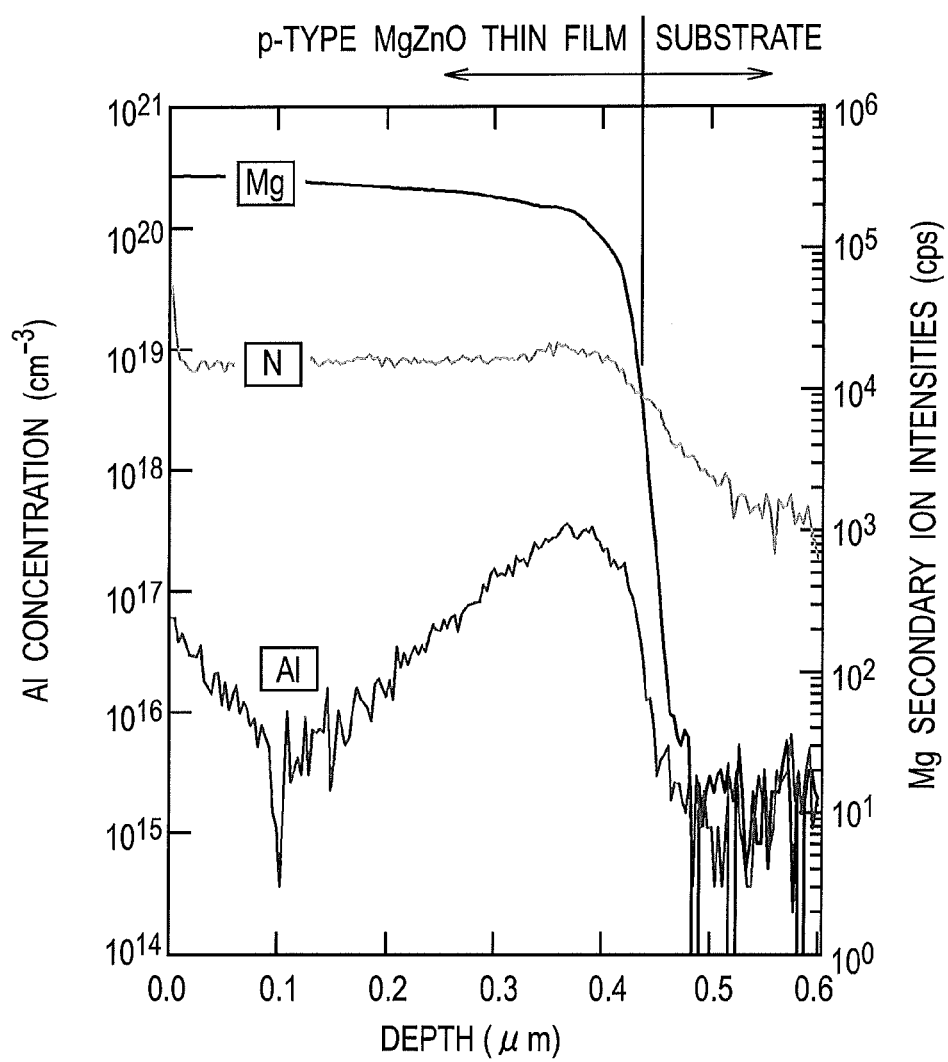
FIG. 11 is an experimental result of a third experiment according to a comparative example.

FIG. 10A and FIG. 11 are graphs showing measurement results by the SIMS measurements. In each of FIG. 10A and FIG. 11, a left-side vertical axis of ordinates represents the concentrations ($cm^{-3}$) of the aluminum and the nitrogen in the logarithm scale, a right-side vertical axis of ordinates represents the secondary ion intensity (counts/second) of the magnesium in the logarithm scale, and a horizontal axis of abscissas represents the depth ($\mu m$) from the surface. Suffixes of the respective curves indicate ions of the respective elements and the compound. Note that, since the substrate made of ZnO is applied, the depth at which Mg is reduced corresponds to an interface between the p-type MgZnO thin film and the substrate. FIG. 10B is a photograph showing a light emission state of the fourth example.

As shown in FIG. 10A, it is recognized that the concentration of the aluminum in the p-type MgZnO thin film according to the fourth example becomes approximately $1.0 \times 10^{16}$ $cm^{-3}$ or less. Meanwhile, as shown in FIG. 11, it is recognized that the concentration of the aluminum in the p-type MgZnO thin film according to the fourth comparative example becomes approximately $1.0 \times 10^{16}$ $cm^{-3}$ or more at most of depths. Note that, as apparent from FIG. 10A and FIG. 11, the concentrations of the nitrogen that becomes the acceptors in the p-type MgZnO thin films in the fourth example and the fourth comparative example are approximately $5.0 \times 10^{18}$ $cm^{-3}$ or more.

Next, as a result of investigating whether the EL light emission was caused in the fourth example and the fourth comparative example, though the fourth example emitted light as shown in FIG. 10B, the light emission was not observed (which is not shown) in the fourth comparative example. From this fact, it is recognized that, though the p-type MgZnO thin film in accordance with the fourth example according to the present invention is converted into the p-type, the p-type MgZnO thin film according to the fourth comparative example, in which the concentration of the aluminum functioning as the donor is high, is not converted into the p-type.

(Fourth Experiment—Relationship Between Boron Concentration and Light Emission)

A description will be made of a fourth experiment in which a relationship between the concentration of the boron in the p-type MgZnO thin film and the light emission was investigated.

In the fourth experiment, as samples for the SIMS and EL measurements, samples were fabricated, each of which was composed of the p-type MgZnO fin film formed on the substrate made of ZnO. Samples according to the present invention were used as a fifth example and a sixth example, and a sample for comparison was used as a fifth comparative example. Note that, in the fifth example, the p-type MgZnO thin film was grown while setting the temperature of the substrate at approximately 870° C., and also in the sixth embodiment, the substrate temperature was set at approximately 870° C. In the fifth comparative example, the p-type MgZnO thin film was grown while setting the temperature of the substrate at approximately 750° C.

First, in the fourth experiment, the concentrations of the nitrogen and the boron (B) and the secondary ion intensity of MgO in the p-type MgZnO thin film were measured by the SIMS method. Thereafter, it was investigated whether the light emission was caused.

Figure 13A:
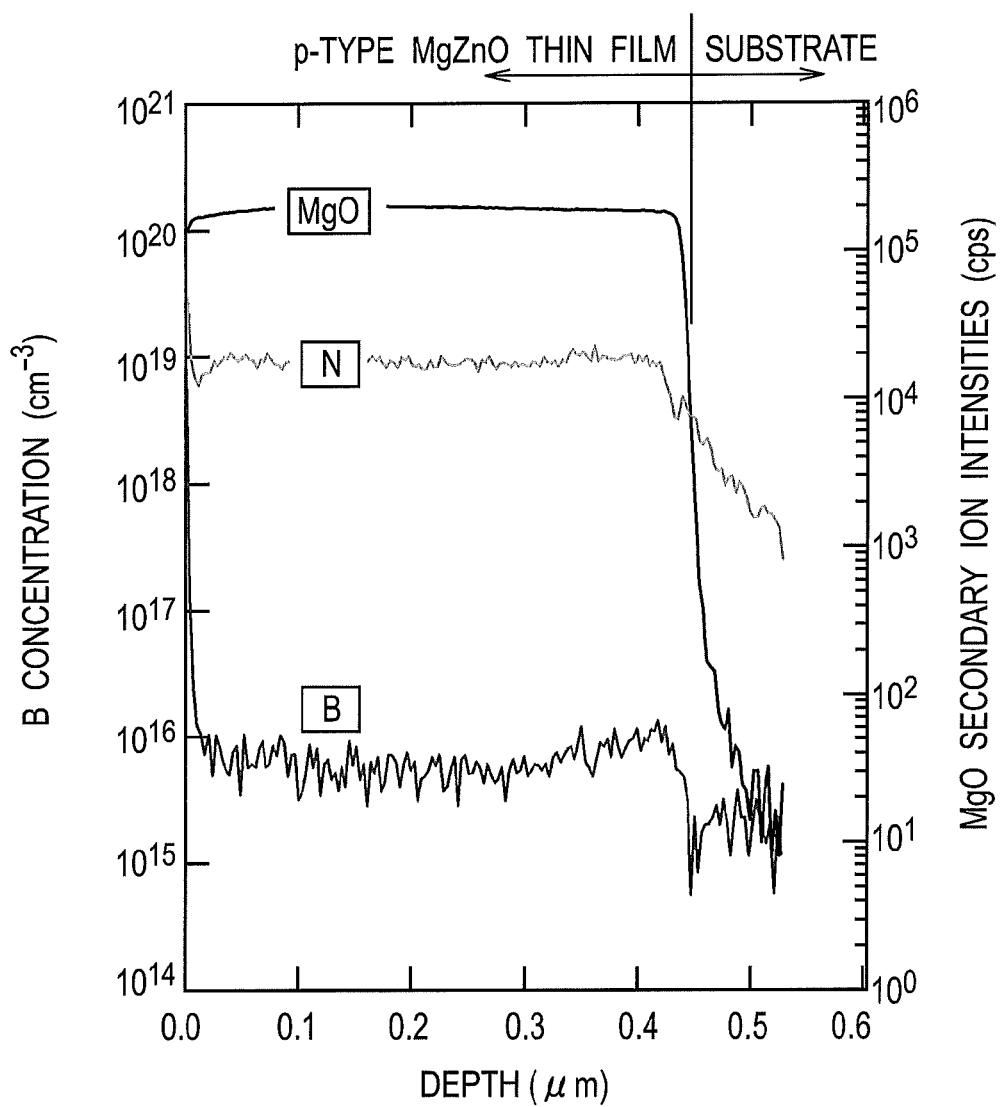
FIGS. 13A and 13B are an experimental result of the fourth experiment according to an example.
Figure 13B:
Figure 14:
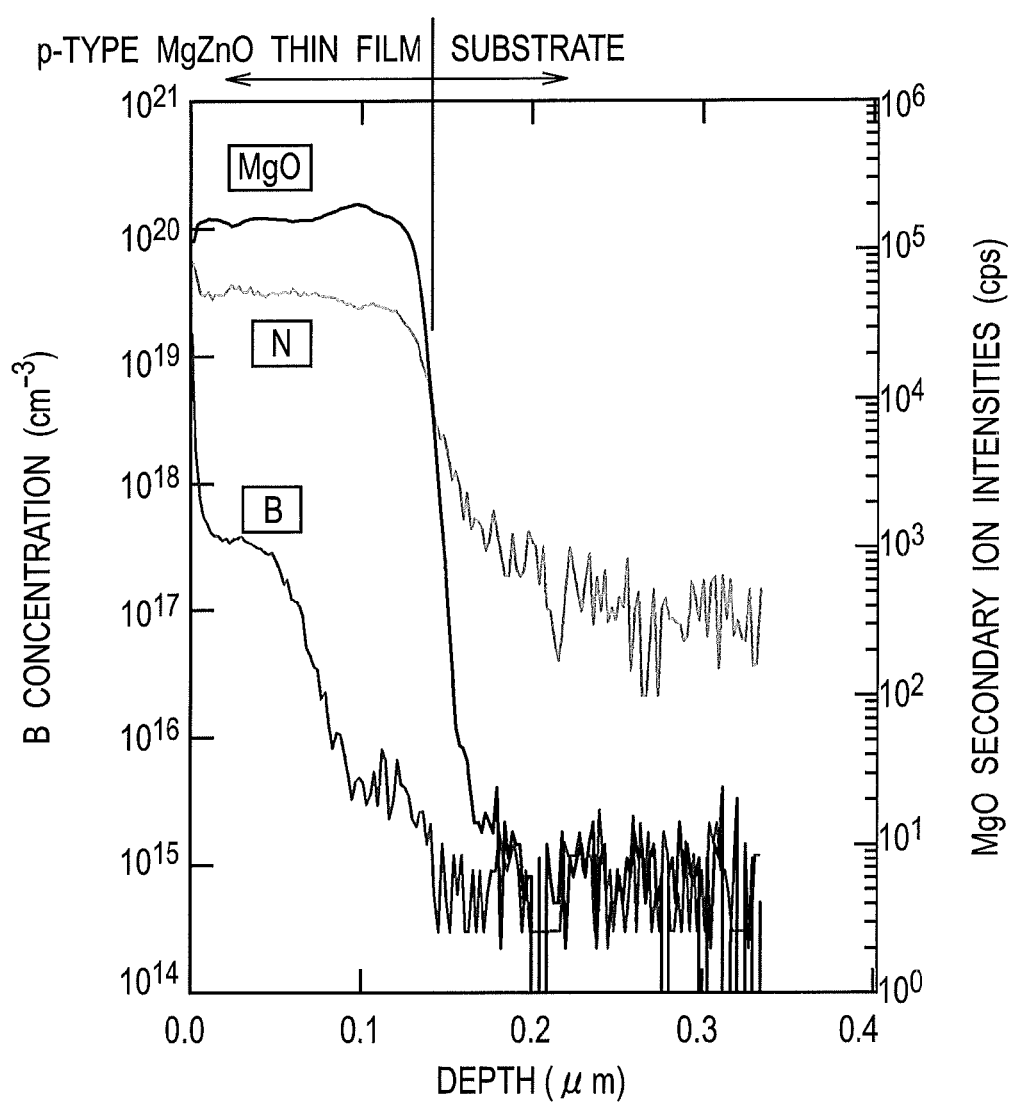
FIG. 14 is an experimental result of a fourth experiment according to a comparative example.

An experimental result of the fifth example is shown in FIG. 12, an experimental result of the sixth example is shown in FIG. 13, and an experimental result of the fifth comparative example is shown in FIG. 14.

Figure 12A:
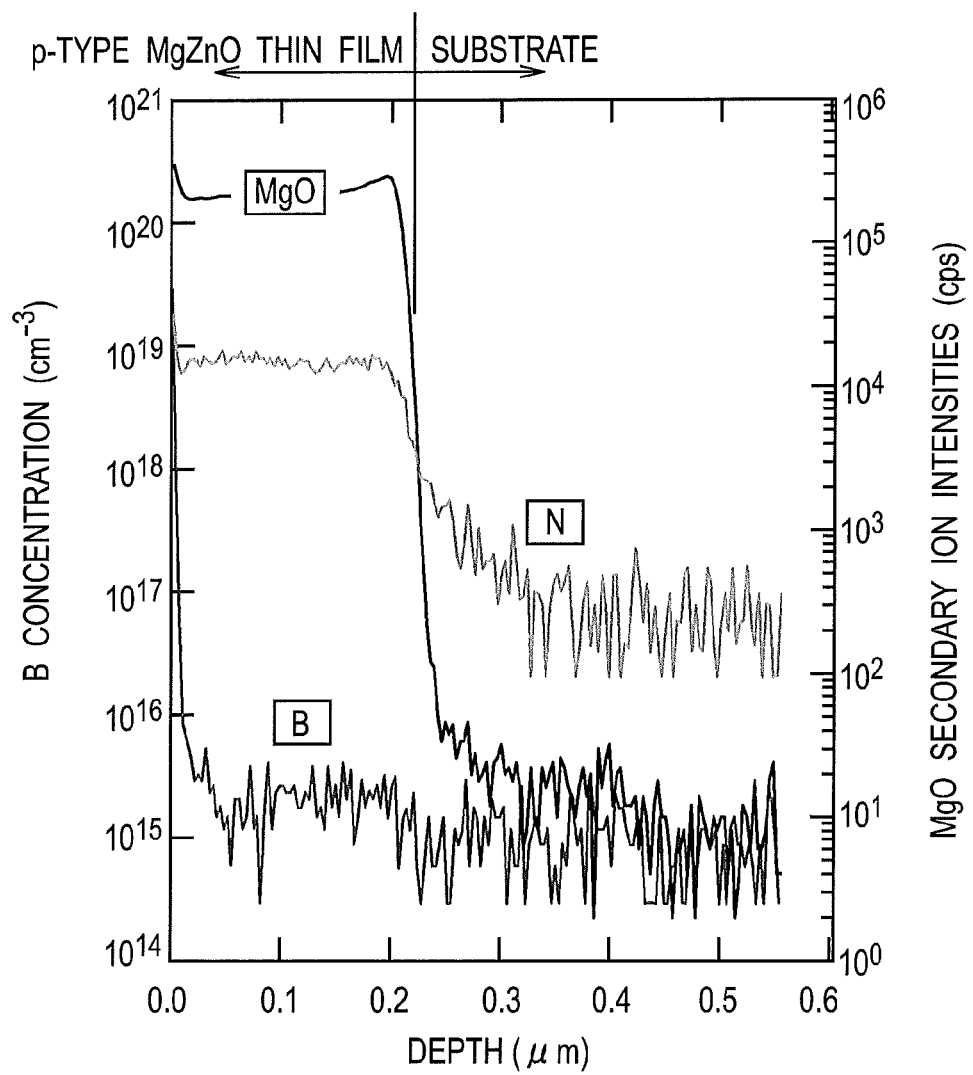
FIGS. 12A and 12B are an experimental result of a fourth experiment according to an example.
Figure 12B:

FIG. 12A, FIG. 13A and FIG. 14 are graphs showing measurement results by the SIMS measurements. In each of FIG. 12A, FIG. 13A and FIG. 14, a left-side vertical axis of ordinates represents the concentrations ($cm^{-3}$) of the boron and the nitrogen in the logarithm scale, a right-side vertical axis of ordinates represents the secondary ion intensity (counts/second) of MgO in the logarithm scale, and a horizontal axis of abscissas represents the depth ($\mu m$) from the surface. Moreover, suffixes of the respective curves indicate ions of the respective elements and the compound. Note that, since the substrate made of ZnO is applied, the depth at which MgO is reduced corresponds to an interface between the p-type MgZnO thin film and the substrate. FIG. 12B and FIG. 13B are photographs showing light emission states of the fifth example and the sixth example.

As shown in FIG. 12A, it is recognized that the concentration of the boron in the p-type MgZnO thin film according to the fifth example becomes approximately $5.0 \times 10^{15}$ $cm^{-3}$ or less. Moreover, as shown in FIG. 13A, it is recognized that the concentration of the boron in the p-type MgZnO thin film according to the sixth example becomes approximately $1.0 \times 10^{16}$ $cm^{-3}$ or less. Note that, though it is observed that the concentration of the boron in a region at a depth of approximately 4 $\mu m$ becomes $1.0 \times 10^{16} cm^{-3}$ or more in FIG. 13A, an occurrence of such a higher concentration is conceived to be within a range of error. Meanwhile, as shown in FIG. 14, it is recognized that the concentration of the boron in the p-type MgZnO thin film according to the fifth comparative example becomes approximately $1.0 \times 10^{16}$ $cm^{-3}$ or more at a depth of 0.08 $\mu m$ or less.

Next, as a result of investigating whether the EL light emission was caused in the fifth example, the sixth example and the fifth comparative example, though the fifth example and the sixth example emitted light as shown in FIG. 12B and FIG. 13B, the light emission was not observed (which is not shown) in the fifth comparative example. From this fact, it is recognized that, though the p-type MgZnO thin films in accordance with the fifth example and the sixth example according to the present invention are converted into the p-type, the p-type MgZnO thin film according to the fifth comparative example, in which the concentration of the boron functioning as the donor is high, is not converted into the p-type.

(Fifth Experiment—EL Spectrum)

Figure 15:
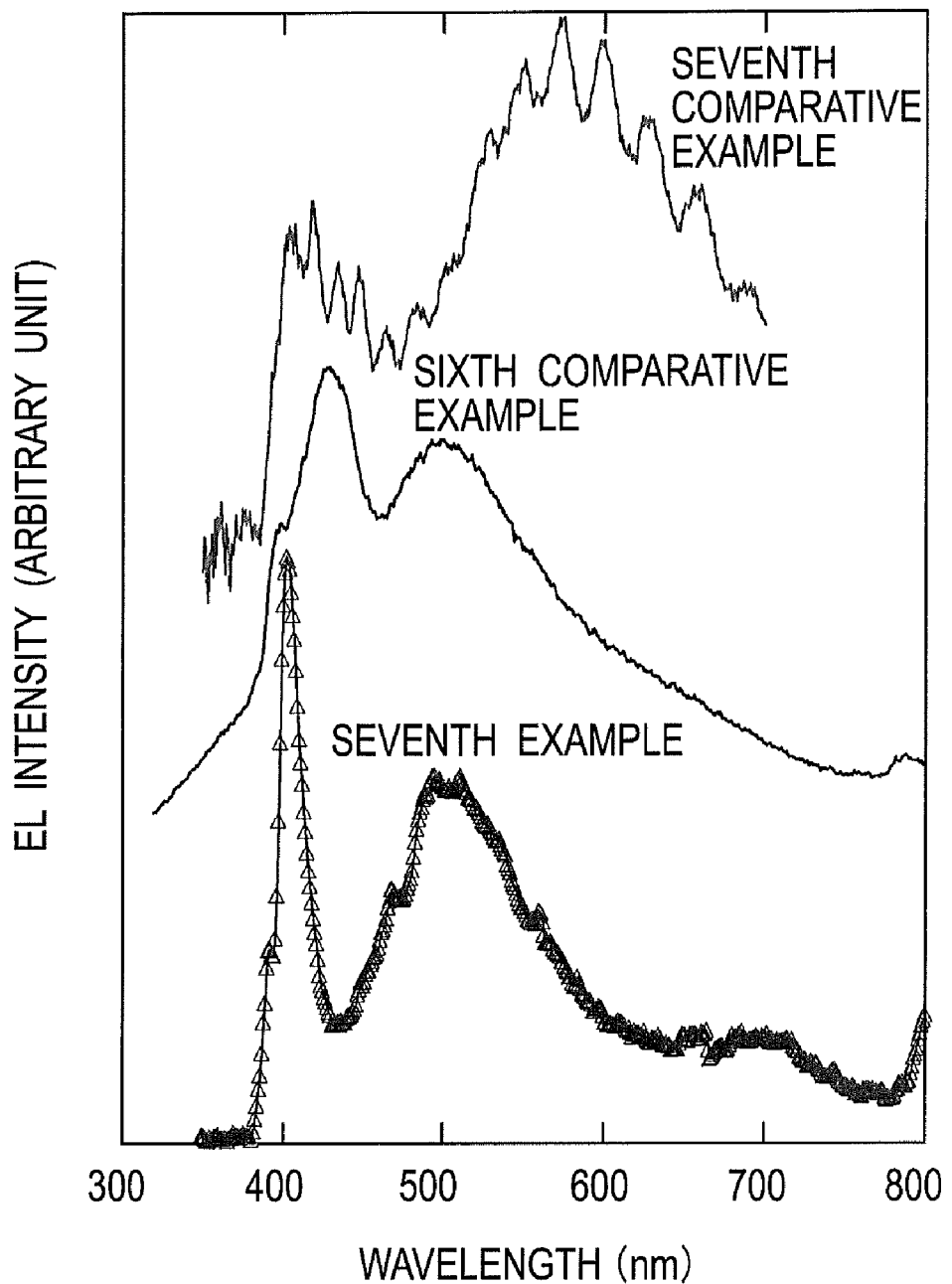
FIG. 15 is experimental results of EL measurement according to an Example and a Comparative example.

Next, a description will be made of a fifth experiment in which an EL spectrum of a seventh example by the semiconductor light emitting device of the second embodiment of the present invention and EL spectra of a sixth comparative example and a seventh comparative example by the semiconductor light emitting devices described in Non-Patent Document 1 and Non-Patent Document 2 were measured. Note that each of the semiconductor light emitting devices according to the sixth comparative example and the seventh comparative example is the one in which n-type, i-type (light emitting layer) and p-type ZnO semiconductor layers are sequentially stacked on the substrate made of ScAlMgO$_4$. An experimental result of the EL measurement of the seventh example and the EL spectra of the sixth comparative example and the seventh comparative example, which are cited from Non-Patent Document 1 and Non-Patent Document 2, are shown in FIG. 15. A vertical axis of ordinates in FIG. 15 represents EL intensity, and a horizontal axis of abscissas represents a wavelength (nm).

As shown in FIG. 15, it is recognized that, in the seventh example according to the present invention, the maximum peak of the EL spectrum is sharper (half width thereof is smaller) than those of the sixth comparative example and the seventh comparative example according to Non-Patent Document 1 and Non-Patent Document 2. Moreover, it is recognized that, in the seventh example, the maximum peak shifts to a short wavelength side as compared with those of the sixth comparative example and the seventh comparative example. These matters are conceived to be because the crystallinity is enhanced in the seventh example by the fact that the concentration of the n-type impurities is decreased. In particular, in consideration that light emission efficiency of light emission (band-end light emission) in the vicinity of a wavelength (up to 380 nm) inherent in ZnO is good, it is recognized that the matter that the maximum peak comes to the vicinity of 380 nm is a large advantage since the light emission efficiency can be increased thereby. Meanwhile, the peaks by the sixth comparative example and the seventh comparative example occur at spots apart from the wavelength concerned (up to 380 nm). This means that light emission efficiencies by the sixth comparative example and the seventh comparative example are low, and that levels owing to impurities and defects are formed, and it is recognized that crystallinity of each thereof is low.

(Sixth Experiment—Influence of Aluminum Contamination)

Next, a description will be made of a sixth experiment in which the concentration of the aluminum and n-type conversion in the ZnO-based semiconductor were investigated. Samples were fabricated, in each of which the ZnO thin film was formed on a substrate made of sapphire. A sample according to the present invention was used as an eighth example, and a sample for comparison was used as an eighth comparative example.

Figure 16:
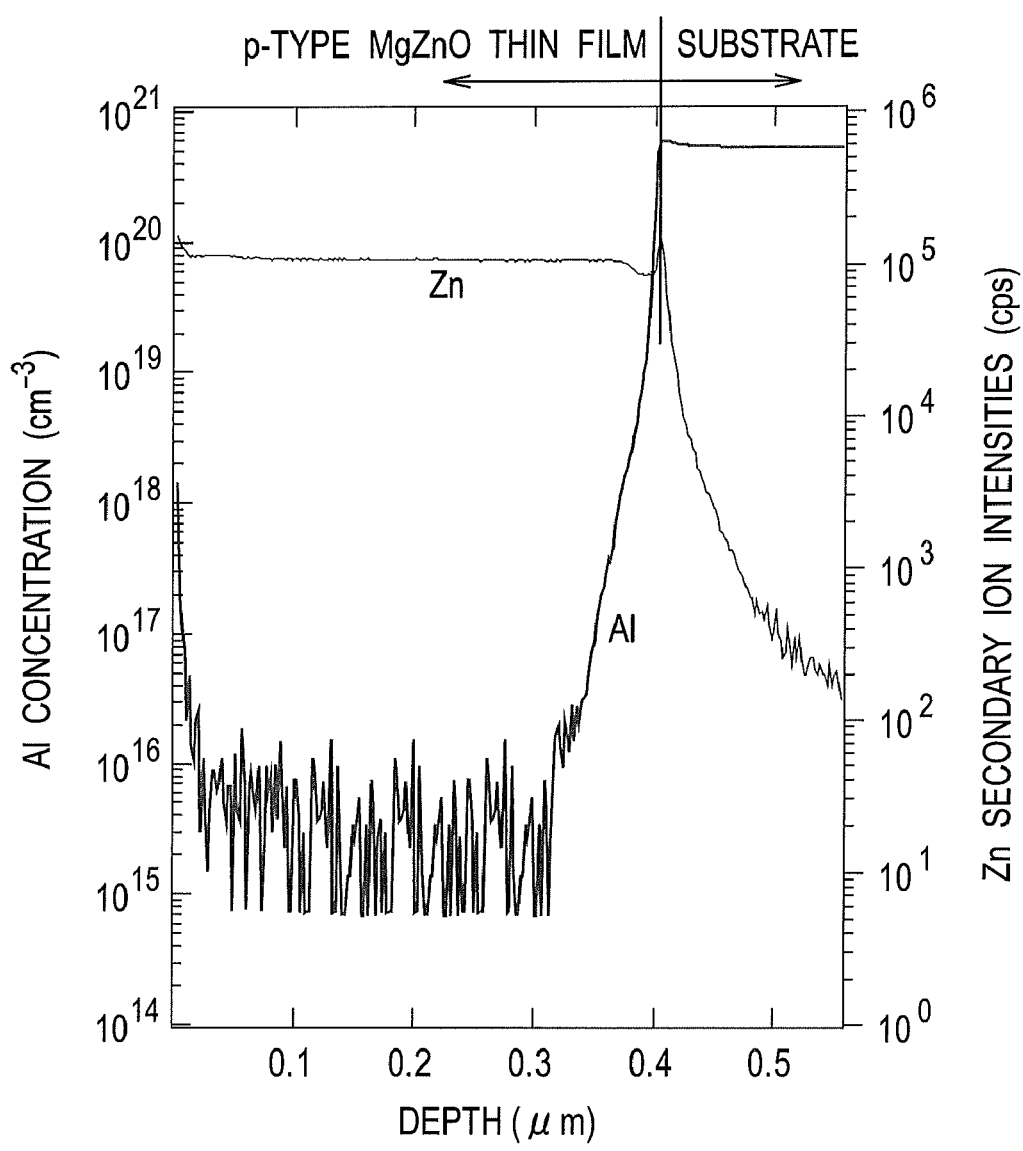
FIG. 16 is a measurement result of a concentration of aluminum according to an example.
Figure 17:
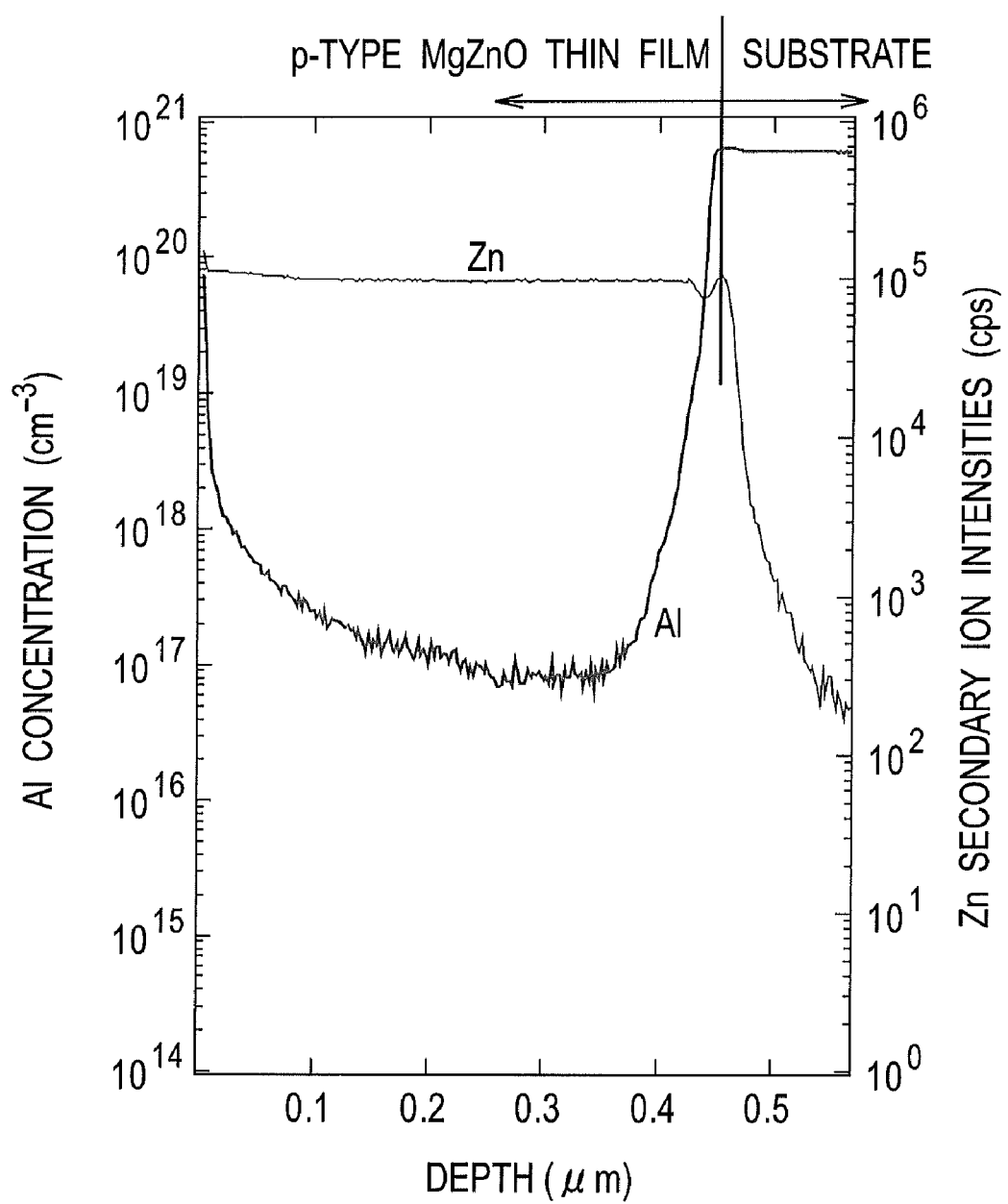
FIG. 17 is a measurement result of a concentration of aluminum according to a comparative example.

Measurement results of measuring the eighth example and the eighth comparative example by the SIMS method are shown in FIG. 16 and FIG. 17, respectively. In each of FIG. 16 and FIG. 17, a left-side vertical axis of ordinates represents the concentrations (cm$^{-3}$) of the aluminum in the logarithm scale, a right-side vertical axis of ordinates represents the secondary ion intensity (counts/second) of the zinc in the logarithm scale, and a horizontal axis of abscissas represents the depth (μm) from the surface. Note that, since the ZnO thin film is formed on the (sapphire) substrate containing the aluminum, an intermediate between a depth at which the concentration of the aluminum rises and a depth at which the concentration of the zinc drops corresponds to an interface between the substrate and the ZnO thin film.

As shown in FIG. 16, it is recognized that the concentration of the aluminum in the ZnO thin film of the eighth example becomes approximately $1.0 \times 10^{16}$ cm$^{-3}$ or less. Meanwhile, as shown in FIG. 17, it is recognized that the concentration of the aluminum in the ZnO thin film according to the eighth comparative example becomes approximately $5.0 \times 10^{17}$ cm$^{-3}$ or more.

Moreover, a concentration of electrons and electron mobilities of the eighth example and the eighth comparative example were investigated. In the eighth example, the concentration of the electrons became $7.42 \times 10^{16}$ cm$^{-3}$, and the electron mobility became 137 cm$^2$V$^{-1}$s$^{-1}$. Meanwhile, in the eighth comparative example, the concentration of electrons became $1.47 \times 10^{17}$ cm$^{-3}$, and the electron mobility became 116 cm$^2$V$^{-1}$s$^{-1}$. As described above, in the eighth comparative example in which the concentration of the aluminum is higher than that of the eighth example, the concentration of the electrons is higher, and the concentration of the aluminum almost coincides with the concentration of the electrons. Accordingly, it is recognized that the aluminum that serves as the donor supplies electrons in which an activation rate is extremely good.

Furthermore, in consideration that the concentration of the electrons must be in $10^{16}$ cm$^{-3}$, it is recognized that it is difficult to convert the ZnO thin film into the p-type at the concentration of the aluminum in the eighth comparative example. Meanwhile, it is recognized that it is possible to convert the ZnO thin film into the p-type at the concentration of the aluminum in the eighth example.

The description has been made above in detail of the present invention by using the embodiments; however, the present invention is not limited to the embodiments described in this specification. The scope of the present invention is the one to be determined by the description of the scope of claims and an equilibrium scope of the description of the scope of claims. Modification examples obtained by combining components of the respective embodiments are also incorporated in the scope of the present invention. A description will be made below of the modification examples in which the above-described embodiments are partially changed.

For example, the p-type impurities contained in the above-mentioned p-type MgZnO thin film are not limited to the nitrogen, and copper (Cu), phosphorous (P) or the like may be used.

Moreover, in the n-type impurities contained in the p-type MgZnO thin film, concentrations of the group IV elements other than the above-mentioned silicon are also preferably $1.0 \times 10^{17}$ cm$^{-3}$ or less.

Furthermore, in the n-type impurities contained in the above-mentioned p-type MgZnO thin film, concentrations of the group III elements other than the above-mentioned aluminum and boron are also preferably $1.0 \times 10^{16}$ cm$^{-3}$ or less.

Furthermore, it is not necessary that the concentrations of the n-type impurities composed of the group IV elements and of the group III elements, which are described in the first embodiment, satisfy all of the above-mentioned conditions, and the concentrations concerned just need to satisfy any one of the conditions.

The invention claimed is:

1. A p-type MgZnO-based thin film comprising:
p-type impurities which become an acceptor,
wherein a concentration of n-type impurities which are a group IV element and become a donor is $1.0 \times 10^{17}$ cm$^{-3}$ or less, and a concentration of the p-type impurities is $5.0 \times 10^{18}$ cm$^{-3}$ or more,
wherein steps substantially perpendicular to an m-axis direction are formed at a substantially equal interval on a surface of a +c-plane on which the p-type MgZnO-based thin film is subjected to be crystal growth.

2. The p-type MgZnO-based thin film according to claim 1, wherein the n-type impurities are silicon.

3. The p-type MgZnO-based thin film according to claim 1, wherein the p-type impurities are nitrogen.

4. The p-type MgZnO-based thin film according to claim 1, wherein a Mg composition ratio of the p-type MgZnO-based thin film is not higher than 50%.

5. A p-type MgZnO-based thin film comprising:
p-type impurities which become an acceptor,
wherein a concentration of n-type impurities which are a group III element and become a donor is $1.0 \times 10^{16}$ cm$^{-3}$ or less, and a concentration of the p-type impurities is $5.0 \times 10^{18}$ cm$^{-3}$ or more,
wherein steps substantially perpendicular to an m-axis direction are formed at a substantially equal interval on a surface of a +c-plane on which the p-type MgZnO-based thin film is subjected to be crystal growth.

6. The p-type MgZnO-based thin film according to claim 5, wherein the n-type impurities are aluminum or boron.

7. The p-type MgZnO-based thin film according to claim 5, wherein a concentration of n-type impurities which are a group IV element and become a donor is $1.0 \times 10^{17}$ cm$^{-3}$ or less.

8. The p-type MgZnO-based thin film according to claim 7, wherein the group IV element is silicon.

9. The p-type MgZnO-based thin film according to claim 5, wherein a Mg composition ratio of the p-type MgZnO-based thin film is not higher than 50%.

10. A semiconductor light emitting device comprising:
a substrate made of an MgZnO-based semiconductor;
a light emitting layer made of an MgZnO-based semiconductor formed on the substrate; and
a p-type MgZnO-based layer formed on the light emitting layer and containing p-type impurities which become an acceptor,
wherein a concentration of n-type impurities made of a group IV element in the p-type MgZnO-based layer is $1.0 \times 10^{17}$ cm$^{-3}$ or less, and a concentration of the p-type impurities is $5.0 \times 10^{18}$ cm$^{-3}$ or more,
wherein steps substantially perpendicular to an m-axis direction are formed at a substantially equal interval on a surface of a +c-plane on which the p-type MgZnO-based thin film is subjected to be crystal growth.

11. The semiconductor light emitting device according to claim 10, wherein the n-type impurities are silicon.

12. The semiconductor light emitting device according to claim 10, wherein a Mg composition ratio of the p-type MgZnO-based layer is not higher than 50%.

13. A semiconductor light emitting device comprising:
a substrate made of an MgZnO-based semiconductor;
a light emitting layer made of an MgZnO-based semiconductor formed on the substrate; and
a p-type MgZnO-based layer formed on the light emitting layer and containing p-type impurities which become an acceptor,
wherein a concentration of n-type impurities made of a group III element in the p-type MgZnO-based layer is $1.0 \times 10^{16}$ cm$^{-3}$ or less, and a concentration of the p-type impurities is $5.0 \times 10^{18}$ cm$^{-3}$ or more,
wherein steps substantially perpendicular to an m-axis direction are formed at a substantially equal interval on a surface of a +c-plane on which the p-type MgZnO-based thin film is subjected to be crystal growth.

14. The semiconductor light emitting device according to claim 13, wherein the n-type impurities are boron or aluminum.

15. The semiconductor light emitting device according to claim 13, wherein a concentration of silicon that functions as a donor is $1.0 \times 10^{17}$ cm$^{-3}$ or less.

16. The semiconductor light emitting device according to claim 13, wherein a Mg composition ratio of the p-type MgZnO-based layer is not higher than 50%.

* * * * *